United States Patent [19]

Kobayashi et al.

[11] Patent Number: 4,969,031
[45] Date of Patent: Nov. 6, 1990

[54] SEMICONDUCTOR DEVICES AND METHOD FOR MAKING THE SAME

[75] Inventors: Yutaka Kobayashi, Hitachi; Takaya Suzuki, Katsuta, both of Japan

[73] Assignee: Hitachi, Ltd., Tokyo, Japan

[21] Appl. No.: 463,608

[22] Filed: Feb. 3, 1983

[30] Foreign Application Priority Data

Feb. 3, 1982 [JP] Japan .................................. 57-14919

[51] Int. Cl.$^5$ ............................................ H01L 29/78
[52] U.S. Cl. ..................................... 357/63; 357/23.1; 357/41; 357/34; 357/35
[58] Field of Search ................. 357/60, 63, 41, 34, 357/23.1, 26, 90; 29/576 E, 576 T

[56] References Cited

U.S. PATENT DOCUMENTS 3,566,215  2/1971  Heywang .............................. 357/60
3,874,936  4/1975  d'Hervilly ............................ 357/90
3,969,753  7/1976  Thorsen ............................... 357/60

OTHER PUBLICATIONS

IEDM Meeting Dec. 1981 by Tsaur, pp. 232-235.
Solid State Electronics, vol. 3, pp. 261-267 by Pfann 1961.

Primary Examiner—Andrew J. James
Assistant Examiner—Mark Prenty
Attorney, Agent, or Firm—Antonelli, Terry, Stout & Kraus

[57] ABSTRACT

A semiconductor device has an active layer in which a semiconductor element is formed by employing a silicon single crystal as a substrate. The present invention causes a tensile strain to remain in the active layer, thereby to improve the carrier mobility.

10 Claims, 4 Drawing Sheets

SEMICONDUCTOR DEVICES AND METHOD FOR MAKING THE SAME

BACKGROUND OF THE INVENTION

The present invention relates to semiconductor devices, particularly transistors, and a method for making the transistors. More specifically, it relates to improvements in a carrier mobility.

It has hitherto been known that transistors include MOSFETs and bipolar (BIP) transistors.

Regarding the MOSFETs, a carrier mobility has been improved by establishing a state in which a tensile strain is exerted on a semiconductor film overlying an insulator. As an example of such improvements, reference is had to "STRESS-ENHANCED MOBILITY IN MOSFETs FABRICATED IN ZONE-MELTING-RECRYSTALLIZED POLY-Si FILMS" reported by B. Y. Tsaur, Johnn C. C. Fan, M. W. Geis, D. J. Silversmith and R. W. Mountain in 'Technical Digest of IEDM (1981)', pp. 232–242, Dec. 1981.

However, there have not been known yet a construction which can improve carrier mobilities when applied to both the MOSFETs and the bipolar transistors, and a method for making the same.

SUMMARY OF THE INVENTION

An object of the present invention is to provide a construction capable of improving carrier mobilities in both MOSFETs and BIP transistors in common, and a method for making the same.

The present invention has been made in view of the phenomenon that, when only a silicon single-crystal layer in a semiconductor device is used and is formed with a tensile strain by applying a tensile stress thereto, the effective mass of electrons lightens owing to the piezoelectric effect, so the mobility of the electrons within the silicon crystal layer is enhanced.

That is, the present invention consists in that an active layer within a silicon (Si) single-crystal layer is made a Si crystal layer with a tensile strain remaining therein, whereby a carrier mobility in the active region of a semiconductor element is enhanced.

By referring to the following description, it will be better understood that the object of the present invention can be accomplished owing to the construction of the present invention as stated above.

DESCRIPTION OF THE PREFERRED EMBODIMENTS

Figure 1A:
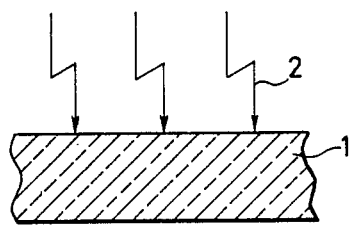
FIGS. 1A to 1D are sectional views for explaining a manufacturing process in the case where the present invention is applied to a MOSFET.

As embodiments of processes for forming a strain in the present invention, a melting and liquid-phase regrowth method and an impurity doping method will be respectively described.

The melting and liquid-phase regrowth method is such that an active layer which includes the principal surface of a Si single-crystal layer and in which, at least, a semiconductor element is to be formed, is irradiated with a laser radiation having a wavelength of, e. g., 8000 Å or below and is thus heated locally to be melted to the extent that it does not flow, whereupon the melted active layer is regrown in a liquid phase under the condition of a temperature approximately equal to the room temperature, thereby intending to cause a tensile strain to remain within the regrown active layer.

That is, since a substrate and the Si single-crystal layer other than the active layer are held at a low temperature without being heated, their shapes including the crystal remain unchanged. On the other hand, the melted active layer is sufficiently thin (for example, several μm) as compared with the substrate or the Si single-crystal layer which has not been melted (hereinbelow, termed "unmelted layer"). Moreover, in the state in which the active layer has been expanded by the thermal melting, it is regrown using the unmelted layer as a seed crystal. Accordingly, the regrown layer tends to shrink when its temperature has lowered down to the room temperature. Since, however, the regrown layer is constrained by the unmelted layer or the substrate, it is not shrunk, and a tensile stress remains therein, so that the tensile strain is formed.

When a semiconductor element is formed in the active layer having the remaining tensile strain thus formed, a semiconductor device of high carrier mobility can be produced. However, it has been experimentally confirmed that the tensile strain formed by the melting and regrowth method is removed by a heat treatment at a temperature higher than 600° C. Therefore, all the steps of the manufacturing process for the semiconductor device after the tensile strain has been formed by this method must be carried out under the conditions of temperatures not higher than 600° C.

The present invention consists in a semiconductor device having an active layer in which a semiconductor element is formed so that current may flow along the crystal orientation of the {100} or {110} face, characterized in that the active layer is a Si crystal layer in which a tensile strain is formed to remain along the {100} or {110} face, whereby a carrier mobility in the active region of the semiconductor element is enhanced.

Further, in the present invention, the face orientation of the active layer in which the semiconductor element is formed may deviate within ±10 ° with reference to the {100} or {110} face.

Now, the melting and liquid-phase regrowth method of the present invention will be described in detail in conjunction with an illustrated embodiment.

FIGS. 1A–1D show all the steps of a manufacturing method for a MOSFET of an embodiment to which the present invention is applied.

Figure 1B:
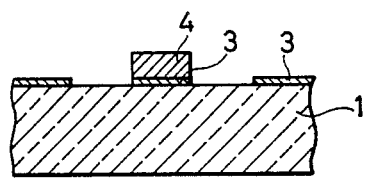
Figure 1C:
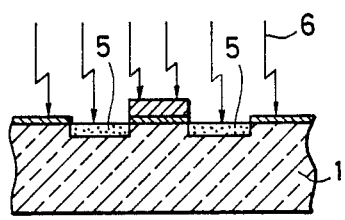
Figure 1D:
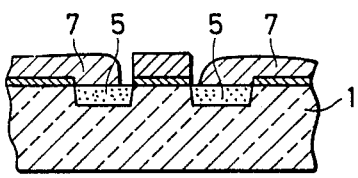

As illustrated in FIG. 1A, a Si single-crystal substrate 1 of the P-conductivity type is irradiated with a ruby laser beam 2 having an energy density of 1.5 J/cm², so as to melt a Si single-crystal layer corresponding to an active layer which includes the principal surface of the substrate 1 and in which a semiconductor element is to be formed. Thereafter, the melted Si single-crystal layer is regrown in a liquid phase by the natural cooling at the room temperature. Thus, a remaining tensile strain is formed within the active layer. Subsequently, as illustrated in FIG. 1B, an oxide film 3 having a desired shape is formed on the surface of the substrate 1 by the plasma CVD (chemical vapor deposition) process. Further, a gate 4 made of polycrystalline Si is formed on a predetermined part of the surface of the oxide film 3 by the reduced-pressure CVD process. In steps shown in FIG. 1C, N-conductivity type regions 5 are formed by implanting phosphorus ions from the exposed parts of the principal surface into the active layer of the substrate 1, and the phosphorus ions are activated by performing laser annealing 6. Next, as illustrated in FIG. 1D, the N-conductivity type regions 5 are provided with Al interconnection buses 7. Then, the N-channel MOSFET is formed. As described before, all the manufacturing steps in FIGS. 1B–1D are conducted at temperatures not higher than 600° C.

According to the present embodiment, the laser beam is employed as the energy source of the melting. This brings forth the effects that the active layer having a desired depth from the principal surface of the Si single-crystal substrate can be melted at high precision in a short time, and that the active layer having the tensile strain can be formed by the very simple step.

For the sake of comparisons, carrier mobilities were actually measured. Then, prior-art MOSFETs had values of 600–700 cm$^2$/V-s, whereas MOSFETs according to the present embodiment had values of 900–1000 cm$^2$/V-s, and the sharp enhancement of the carrier mobility was noted.

While the embodiment has been explained as employing the ruby laser beam for the energy source of the melting step, this is not restrictive, but there may be used any other laser, a flash lamp, a source for producing an electromagnetic wave such as electron beam, or any other heat source.

In the embodiment, the melting and regrowth step for forming the strain has been the first step in FIG. 1A. However, this step need not always be the first, but it ought to be determined at will in view of the whole manufacturing process of a semiconductor device. Essential is that, in the state in which a semiconductor device has been formed, the tensile strain is formed to remain has been formed, the tensile strain is formed to remain in the active layer of a semiconductor element.

Further, while the embodiment has applied the plasma CVD process as the method for forming the oxide film, it is also possible to employ the anodic oxidation process, the normal-pressure CVD process, or a method with these processes combined.

In the above, the melting and regrowth method has been explained. In the next place, a strain forming method based on impurity doping will be described.

The impurity doping method includes two expedients. As the first expedient, an active layer which includes the principal surface of a Si single-crystal layer and in which at least a semiconductor element is to be formed is doped with an impurity which has a covalent radius smaller than that of Si, thereby intending to make the lattice constant of the active layer small and to cause a tensile strain to remain within the active layer. The second expedient concerns a semiconductor device having a Si single-crystal substrate layer, and is such that after the Si single-crystal substrate layer has been doped with an impurity which has a covalent radius larger than that of Si, a Si crystal layer having a lattice constant smaller than that of the resultant substrate layer is grown on the substrate layer and is used as an active layer, thereby intending to form a tensile strain within the active layer.

That is, with the first expedient, when a Si single crystal is doped with an impurity which has a covalent radius smaller than that of Si, naturally the lattice constant of the Si crystal layer becomes small. Therefore, when the active layer of the Si single-crystal layer whose lattice constant is constrained by a supporting substrate or a Si single-crystal substrate layer sufficiently thicker than the active layer is doped with, for example, B (boron) of 0.88Å smaller than 1.17Å of Si in the following table indicative of the radii of the tetrahedral covalent bonds of various elements, the crystal lattice of the active layer undergoes a stress tending to shrink it. Since, however, the lattice constant is constrained by the substrate or the like, a tensile strain is formed within the active layer.

In addition, with the second expedient, a Si single-crystal substrate which is doped with an impurity having a covalent radius larger than that of Si is applied, and an undoped Si single-crystal layer or a Si crystal layer doped with an impurity having a covalent radius smaller than that of Si is grown on the principal surface of the substrate, whereby an active layer having a tensile strain can be formed.

TABLE
UNIT: Å

|  | Be | B | C | N | O | F |
|---|---|---|---|---|---|---|
|  | 1.06 | 0.88 | 0.77 | 0.70 | 0.66 | 0.64 |
|  | Mg | Al | Si | P | S | Cl |
|  | 1.40 | 1.26 | 1.17 | 1.10 | 1.06 | 0.99 |
| Cu | Zn | Ga | Ge | As | Se | Br |
| 1.35 | 1.31 | 1.26 | 1.22 | 1.18 | 1.14 | 1.11 |
| Ag | Cd | In | Sn | Sb | Te | I |
| 1.52 | 1.48 | 1.44 | 1.40 | 1.36 | 1.32 | 1.28 |
|  | Hg | Tl | Pb | Bi |  |  |
|  | 1.48 | 1.47 | 1.46 | 1.45 |  |  |

Accordingly, the impurity doping method has the effects that a tensile strain of any desired magnitude can be formed by controlling the kind and doping quantity of a doping impurity, and that the strain thus formed is not removed by a heat treatment unlike the tensile strain formed by the melting and regrowth method.

Further, concrete embodiments to which the impurity doping method is applied will be described in detail.

First, there will be explained an embodiment of a method for producing an N-channel MOSFET by the use of a P-conductivity type Si single-crystal substrate which has a face orientation of {100} and an impurity density of $10^{16}$ cm$^{-3}$ or less.

After B ions have been implanted at $3 \times 10^{15}$ cm$^{-2}$ from the principal surface of the P-conductivity type Si single-crystal substrate down to the depth of an active layer, P (phosphorus) ions are implanted at $2.9 \times 10^{15}$ cm$^{-2}$ in order to compensate for carriers and to adjust a carrier density. Thereafter, the resultant substrate is annealed in an N$_2$ atmosphere at a temperature of 1100° C. for 40 minutes, to subtitute the implanted impurity atoms for the lattice positions of Si atoms. Thus, a tensile strain is formed within the active layer because the covalent radii of P and B are smaller than that of Si. A desired element is formed within the active layer formed in this way, by a conventional MOS manufacturing process, whereby a high-speed N-channel MOSFET is produced.

Figure 2:
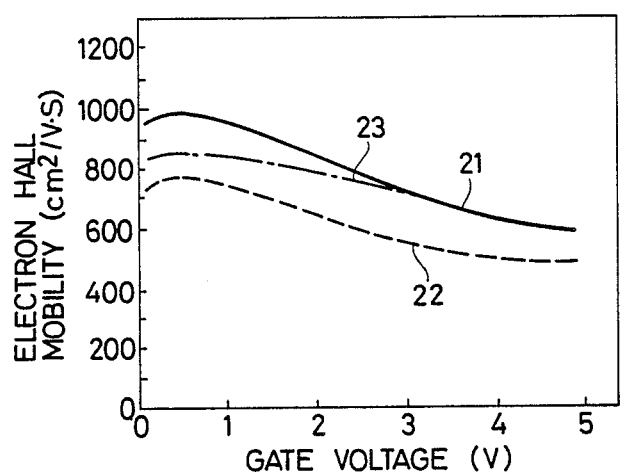
FIG. 2 is a graph showing in comparison with those in prior-art examples, the variation of the electron Hall mobility versus the gate voltage in an N-channel MOSFET to which the present invention is applied.

Thus, the present embodiment could attain effects similar to those of the foregoing embodiment. When the channel mobilities of the MOSFET produced according to the present embodiment and a prior-art MOSFET with no tensile stress applied to a Si single-crystal layer were compared, results as shown in FIG. 2 were obtained. In the figure, the axis of abscissas represents the absolute voltage $V_G$ (V) of (the gate voltage—the threshold voltage), while the axis of ordinates represents the electron Hall mobility ($cm^2/V-s$). The electron Hall mobility of the present embodiment is indicated by a solid line 21, and that of the prior-art example in which no tensile stress was applied to the Si single-crystal layer is indicated by a broken line 22. As seen from the figure, the electron Hall mobility of the MOSFET according to the present embodiment is 900–1000 $cm^2/V-s$, whereas that of the prior-art MOSFET is 600–700 $cm^2/V-s$. According to the present embodiment, therefore, the electron Hall mobility is enhanced by 20–30%.

In the example reported by B. Y. Tsaur et al as mentioned before, crystalline silicon is deposited on amorphous quartz by the chemical vapor deposition. Therefore, a boundary surface exists between the amorphous quartz and the crystalline silicon. The existence of the boundary surface leads to the fact that a large number of crystal defects exist at the boundary surface. The crystal defects check the movements of carriers, and suppress the effect which is attained by bringing silicon into a tensile strain state. Further, a large quantity of leakage current is generated by the crystal defects. The electron Hall mobility of the known example becomes a characteristic indicated by numeral 23 in FIG. 2.

In contrast, in the present invention, silicon is epitaxially stacked on crystalline silicon. Therefore, a boundary surface as in the case of the known example does not exist between the former and latter silicon materials. Accordingly, the crystal of the deposited silicon layer is perfect, and no crystal defect exists. In accordance with the present invention, the effect based on the tensile strain of the deposited silicon can be satisfactorily demonstrated. Besides, in accordance with the present invention, leakage current is very small because the boundary between silicon and an amorphous insulator does not exist under the silicon layer as does in the known example. According to the present embodiment, the electron Hall mobility is enhanced by about 10% as compared with that of the known example.

In the next place, there will be explained an embodiment of a method for producing a MOSFET with a Si single-crystal substrate which is doped with In at about $10^{19}$ $cm^{-3}$.

On the principal surface of a Si single-crystal substrate doped with In (indium) having a covalent radius larger than that of Si, a Si crystal layer containing B as an impurity at a density of $10^{16}$ $cm^{-3}$ is grown to a thickness of about 5 $\mu$m at a growing temperature of 1100° C. Thus, using the crystal of the Si single-crystal substrate of larger lattice constant as a seed crystal, the Si crystal layer of smaller lattice constant is formed by the growth. Consequently, a tensile strain is formed within the grown layer, namely, active layer. A desired N-channel MOSFET is formed within the active layer thus formed, in conformity with a conventional manufacturing process, whereby a high-speed N-channel MOSFET is manufactured.

Accordingly, the present embodiment could attain effects similar to those of the foregoing embodiment in which the P-conductivity type Si single-crystal substrate had the impurity implanted thereinto so as to form the tensile strain.

Further, there will be described an embodiment of an SOS (silicon on sapphire) type MOSFET to which the present invention is applied.

On a sapphire substrate having the {1102} face, a Si single-crystal layer is grown by 0.5 $\mu$m at a growing temperature of about 1000° C. Thereafter, B ions and P ions are respectively implanted at $3\times10^{15}$ $cm^{-2}$ and $2.9\times10^{15}$ $cm^{-2}$, whereupon the resultant substrate is annealed in an $N_2$ atmosphere at a temperature of 1100° C. for 40 minutes, thereby to substitute impurity atoms for the lattice positions of Si atoms. In this way, a tensile strain is formed within the Si single-crystal layer on the sapphire substrate in the way similar to the foregoing. An N-channel MOSFET is formed by employing the Si single-crystal layer thus formed as an active layer and in conformity with a conventional manufacturing process which applies no tensile stress on a Si single-crystal layer, whereby a high-speed SOS type MOSFET is produced.

Figure 3:
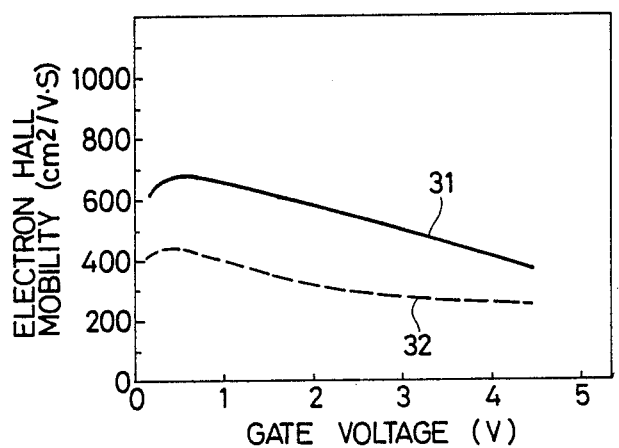
FIG. 3 is a graph showing in comparison with that in a prior-art example, the variation of the electron Hall mobility versus the gate voltage in an SOS type MOSFET to which the present invention is applied.

The channel mobilities of the SOS type MOSFET manufactured by the present embodiment and an SOS type MOSFET in a prior art were compared, and the results are shown in FIG. 3. In the figure, the axis of abscissas represents the absolute voltage $V_G$ (V) of (the gate voltage—the threshold voltage), while the axis of ordinates represents the channel mobility M ($cm^2/V-s$). The channel mobility of the MOSFET of the present embodiment as indicated by a solid line 31 is 700 $cm^2/V-s$ at the maximum, whereas the channel mobility of the prior-art MOSFET having no tensile stress applied to the Si single-crystal layer as indicated by a broken line 32 reaches only 400 $cm^2/V-s$ at the maximum.

In this manner, in the prior-art SOS type MOSFET with no tensile stress applied to the Si single-crystal layer, a compressive strain is formed in the grown layer of the Si single crystal in which the semiconductor element is to be formed, so that the electron mobility is, in general, small. In contrast, according to the present embodiment, the grown layer can be turned to have the tensile strain, and this brings forth the effect that the electron mobility can be remarkably enhanced.

Although the foregoing embodiments have referred only to the MOSFETS, it is needless to say that the present invention is not restricted thereto. More specifically, the tensile strain is formed to remain within the active layer in which the active regions of a semiconductor element are to be formed, whereby the carrier mobility is enhanced. Therefore, when a semiconductor device such as an LSI is produced with the Si substrate formed by the manufacturing method of the present invention, a fast operating LSI can be realized. In addition, narrowing current paths is also possible, so that the density of integration can be raised. By way of example, when actually measured as to a MOSFET/LSI to which the present invention was applied, the response rate was enhanced by about 30% and also the density of integration by about 30% in comparison with those of a prior-art one in which no tensile stress was applied to a Si single-crystal layer.

The embodiments based on the impurity doping method have been explained as to the examples which applied B, P or In as an impurity, but the present invention is not restricted thereto. Moreover, it is also allowed to employ the combination of impurities which can attain a similar effect as an additional effect. For example, impurities such as C (carbon) may be used which becomes electrically inactive when a Si crystal layer is doped therewith.

As set forth above, according to the present invention, the fast operating semiconductor device of high carrier mobility can be produced by the simple method of manufacture even when a Si single crystal having the same crystallinity as in the prior art is used.

Referring now to FIGS. 4A–4D and FIGS. 5A–5D, there will be explained cases where the present invention is applied to BIP transistors.

Figure 4A:
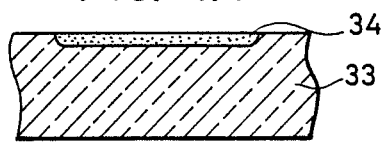
FIGS. 4A to 4D are sectional views for explaining a manufacturing process for a PNP-BIP transistor to which the present invention is applied.
Figure 4B:
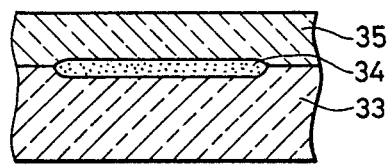
Figure 4C:
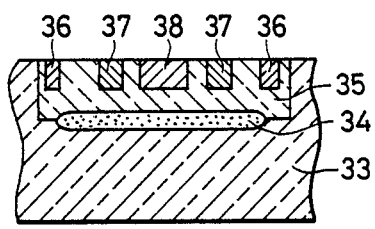
Figure 4D:
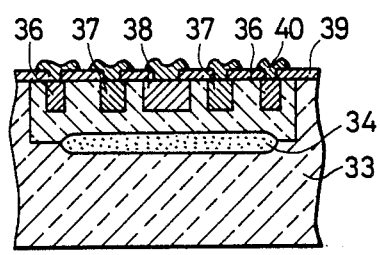

FIGS. 4A–4D are sectional views of an embodiment of the present invention in the case where carriers flow in parallel with the surface of a transistor. First, as shown in FIG. 4A, a silicon substrate 33 which has the (100) face and which is doped with a large quantity of Sb having a covalent radius larger than that of Si is prepared, and a region 34 is doped with In which is a P-type impurity and which has a covalent radius larger than that of Si, by diffusion or ion implantation in order to lower an electric conductivity. Subsequently, as shown in FIG. 4B, a silicon layer 35 which is doped with B having a covalent radius smaller than that of Si is formed by the vapor epitaxial growth process. Thus, the silicon layer 35 comes to have a lattice constant smaller than that of the silicon substrate 33. Thereafter, as shown in FIG. 4C, a base region 36, a collector region 37 and an emitter region 38 are formed by photolithography, diffusion, ion implantation, CVD or the like. Next, as shown in FIG. 4D, an $SiO_2$ layer 39 and electrodes 40 are provided. As the impurity to be diffused into the base region 36, collector region 37 and emitter region 38, P which is smaller in the covalent radius than Si is used.

According to the construction shown in FIGS. 4A–4D, that face in the silicon layer 35 serving as the active layer along which current flows is the (100) face, and a tensile strain acts in parallel with the active layer, so that the carrier mobility increases as described before. In a prior-art construction in which no tensile strain is exerted on the active layer, the carrier mobility is about 900 $cm^2/V-s$, whereas in the present embodiment, it becomes about 1200 $cm^2/V-s$. As a result, the embodiment increases the diffusion coefficient and diffusion length of carriers to about 1.3 times in comparison with those of the prior-art BIP transistor in which no tensile strain is exerted on the active layer. This brings forth the advantages that the BIP transistor according to the present invention has a higher operating speed than in the prior art, and that it facilitates the design of an IC device.

In the above embodiment of FIGS. 4A–4D, the silicon substrate doped with Sb in large quantities has been used, but the doping with the large quantity of Sb is sometimes impossible in the design of an IC. In this case, the silicon substrate may be doped with a large quantity of Sn or Ge which is electrically neutral and which has a larger covalent radius, and it may be doped with Sb in only a proper quantity required.

Figure 5A:
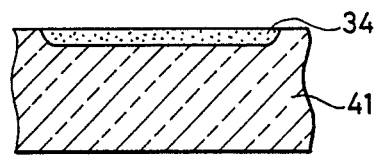
FIGS. 5A to 5D are sectional views for explaining another manufacturing process for a PNP-BIP transistor to which the present invention is applied.
Figure 5B:
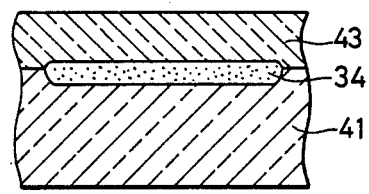
Figure 5C:
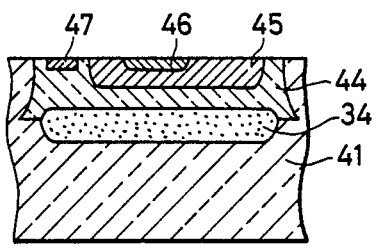
Figure 5D:
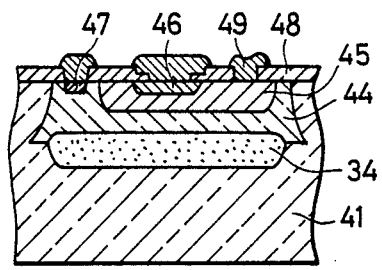

The present invention is also applicable to a BIP transistor in which carriers flow perpendicularly to the surface of the transistor. FIGS. 5A–5D are sectional views of such embodiment. As shown in FIG. 5A, a silicon substrate 41 is doped with B and/or C having covalent radii smaller than that of Si, simultaneously or singly. A region 34 is doped with Sb. As shown in FIG. 5B, an epitaxial layer 43 is doped with Sb which has a covalent radius larger than that of Si, either with or without Sn or Ge which is electrically neutral and which has a larger covalent radius. In the subsequent steps, a region shown at numeral 45 in FIG. 5C is doped with In or Ga larger in the covalent radius than Si, and a region shown at numeral 46 is doped with P smaller in the covalent radius than Si. In a step shown in FIG. 5D, electrodes 49 are respectively formed on a collector region 44, an emitter region 46 and the base region 45.

Thus, the base region 45 undergoes a compressive strain in a plane parallel to its surface, so that a tensile strain arises in a plane perpendicular to the surface, namely, a plane along which current flows. In this manner, the object of the present invention can be achieved even when the current flows in the direction perpendicular to the surface. The carrier mobility in the present embodiment is enhanced by about 30% as compared with that in a prior-art device in which no tensile strain is exerted on the active layer, likewise to the case of the embodiment in FIGS. 4A–4D.

We claim:

1. A semiconductor device having:
   an active layer of a semiconductor element;
   a silicon single-crystal layer of one conductivity type which includes the {100} face or {110} face and which constitutes a substrate for forming the active layer of a semiconductor element in a surface layer of said silicon single-crystal layer, said active layer including one principal surface of said silicon single-crystal layer,
   an oxide film which is formed on parts of the one principal surface of said substrate,
   a gate electrode which is formed on one of said parts of said oxide film,
   regions to have a conductivity type opposite to that of said silicon single-crystal layer, said regions being formed under exposed parts of said one principal surface of said substrate, and
   interconnection buses which are formed on said region;
   wherein said active layer is a surface layer of the silicon single-crystal layer that is melted and regrown in a liquid phase by irradiating the silicon single-crystal layer with a heat source for melting the surface layer including the one principal surface of the silicon single-crystal layer, whereby said active layer is formed with a remaining tensile strain in advance, said tensile strain being formed along a crystal orientation of the active layer, the crystal orientation being the direction along which current flows in the semiconductor element, the active layer being relatively thin as compared to the thickness of the remainder of the silicon single-crystal layer.

2. A semiconductor device according to claim 1, wherein said regions to have the opposite conductivity to that os said silicon single-crystal layer are activated by annealing.

3. A semiconductor device having:
   a silicon single-crystal layer which includes the {100} face or {110} face and which constitutes a substrate for forming an active layer of semiconductor element,
   an active layer of a semiconductor element formed on the silicon single-crystal layer, said active layer being of one conductivity type, an oxide film which is formed on parts of one principal surface of said active layer, a gate electrode which is formed on one of said parts of said oxide film, regions to have a conductivity type opposite to that of said active layer, said regions being formed under exposed parts of said one principal surface of said active layer, and interconnection buses which are formed on said regions;

wherein said silicon single-crystal substrate layer, on which the active layer is formed, is doped with an impurity which has a covalent radius larger than that of silicon, and wherein said active layer, which is a silicon single-crystal layer, is grown on the silicon single-crystal layer and has a lattice constant smaller than that of the silicon single-crystal layer, whereby a remaining tensile strain is formed within said active layer, said tensile strain being formed along a crystal orientation of said active layer, said crystal orientation being in a direction of current flow in the semiconductor element.

4. A semiconductor device having:

a first silicon layer which has the {100} face of the {110} face and which is doped with a first impurity, a layer which is doped with a second impurity and which is formed in a part of one principal surface of said first silicon layer, a second silicon layer which is doped with a third impurity and which is formed by vapor growth on said one principal surface including said layer doped with a second impurity, said second silicon layer constituting a silicon active layer of the device, an emitter region, a collector region and a base region which are formed in said second silicon layer, and interconnection buses which are formed on the respective regions;

current flowing through the silicon active layer substantially in parallel with said one principal surface;

wherein said first impurity is an impurity which has a covalent radius larger than that of silicon, said second impurity is an impurity which has a covalent radius larger than that of silicon, and said third impurity is an impurity which has a covalent radius smaller than that of silicon.

5. A semiconductor device having:

a first silicon layer which has the {100} face or the {110} face and which is doped with a first impurity, a layer which is doped with a second impurity and which is formed in a part of one principal surface of said first silicon layer, a second silicon layer which is doped with a third impurity and which is formed by vapor growth on said one principal surface including said layer doped with said second impurity, a third silicon layer which is formed by doping said second silicon layer with a fourth impurity, a fourth silicon layer which is formed by doping said third silicon layer with a fifth impurity, a collector region, a base region and an emitter region which are respectively formed in said second, third and fourth silicon layers, and interconnection buses which are formed on the respective regions;

current flowing through a silicon active layer substantially orthogonally to said one principal surface;

wherein said first impurity is an impurity which has a covalent radius smaller than that of silicon, said second impurity is an impurity which has a covalent radius larger than that of said silicon, said third impurity is an impurity which has a covalent radius larger than that of said silicon, said fourth impurity is an impurity which has a covalent radius larger than that of said silicon, and said fifth impurity is an impurity which has a covalent radius smaller than that of said silicon.

6. A semiconductor device according to claim 4, wherein said first impurity includes Sb.

7. A semiconductor device according to claim 4, wherein said first impurity includes Sn or Ge.

8. A semiconductor device according to claim 4, wherein a tensile strain is formed within the active layer in a direction substantially in parallel with said one principal surface so as to be in the direction of current flowing through the silicon active layer.

9. A semiconductor device according to claim 5, wherein a tensile strain is formed within the active layer in a direction substantially orthogonally to the one principal surface so as to be in the direction of current flowing through the silicon active layer.

10. A semiconductor device according to claim 3, wherein said active layer is doped with an impurity, the covalent radius of the impurity doped into the active layer being smaller than that of silicon.

* * * * *